(12) United States Patent
Yasuda

(10) Patent No.: US 7,042,150 B2
(45) Date of Patent: May 9, 2006

(54) LIGHT-EMITTING DEVICE, METHOD OF FABRICATING THE DEVICE, AND LED LAMP USING THE DEVICE

(75) Inventor: Takaki Yasuda, Chiba (JP)

(73) Assignee: Showa Denko K.K., Tokyo (JP)

( * ) Notice: Subject to any disclaimer, the term of this patent is extended or adjusted under 35 U.S.C. 154(b) by 132 days.

(21) Appl. No.: 10/742,640

(22) Filed: Dec. 22, 2003

(65) Prior Publication Data

US 2004/0189184 A1    Sep. 30, 2004

Related U.S. Application Data

(60) Provisional application No. 60/436,471, filed on Dec. 27, 2002.

(30) Foreign Application Priority Data

Dec. 20, 2002   (JP) .............................. 2002-369092

(51) Int. Cl.
*H01L 33/00* (2006.01)

(52) U.S. Cl. ...................... 313/498; 313/512; 362/800; 257/98; 257/103

(58) Field of Classification Search ................ 313/498, 313/499, 512; 362/800, 98, 103
See application file for complete search history.

(56) References Cited

U.S. PATENT DOCUMENTS

| 6,066,861 A * | 5/2000 | Hohn et al. ................... 257/99 |
| 6,635,363 B1 * | 10/2003 | Duclos et al. .............. 428/690 |
| 6,791,259 B1 * | 9/2004 | Stokes et al. ............... 313/503 |

FOREIGN PATENT DOCUMENTS

JP       2002-164296      6/2002

OTHER PUBLICATIONS

Kazuyuki Tadatomo, et al.; "High Output Power InGaN Ultraviolet Light-Emitting Diodes Fabricated on Patterned Substrates Using Metalorganic Vapor Phase Epitaxy"; Japan Journal of Applied Physics; vol. 40; Part 2, No. 6B, Jun. 15, 2001; pp. L 583-L 585.

* cited by examiner

*Primary Examiner*—Ashok Patel
(74) *Attorney, Agent, or Firm*—Sughrue Mion, PLLC

(57) ABSTRACT

A semiconductor light-emitting device has a substrate (1), a semiconductor layer (3) and a light-emitting layer (5), and the substrate is furnished on the surface thereof underlying the semiconductor layer with an irregular construction possessing inclined lateral surfaces forming an angle θ to the substrate in the range of 30°<θ<60°, to provide a light-emitting device enhanced in the effect of fetching light.

24 Claims, 4 Drawing Sheets

F I G. 2
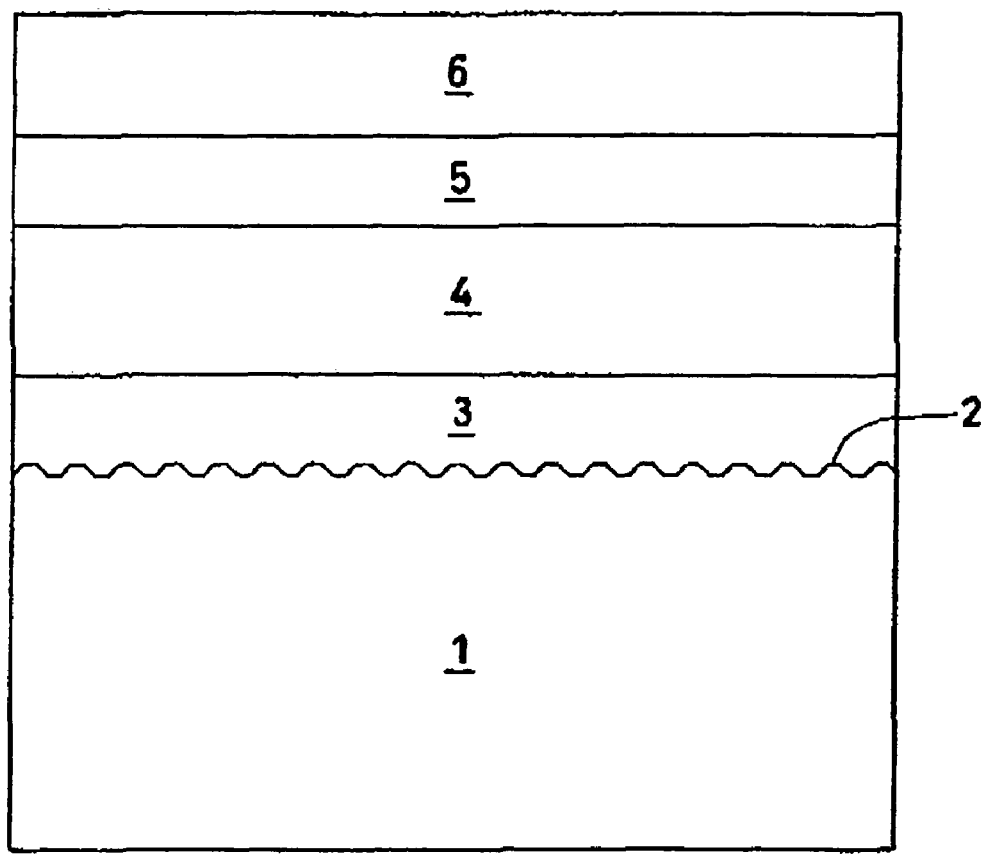

F I G. 3 a
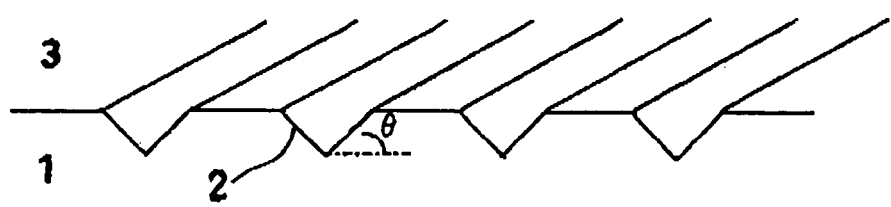
F I G. 3 b
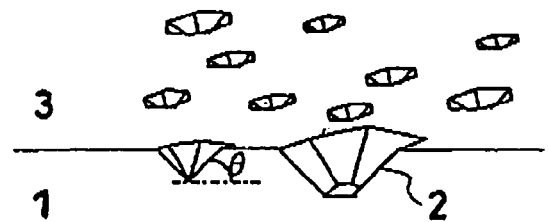
F I G. 3 c
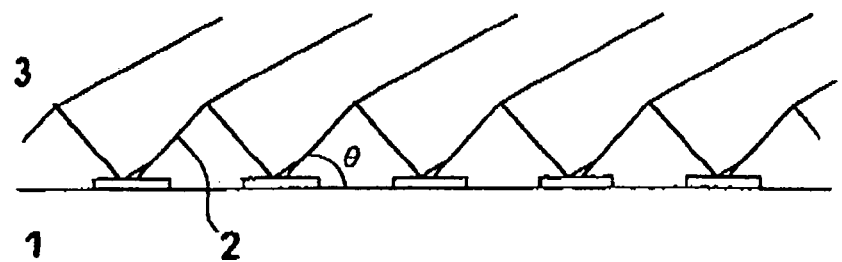

LIGHT-EMITTING DEVICE, METHOD OF FABRICATING THE DEVICE, AND LED LAMP USING THE DEVICE

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/436,471 filed Dec. 27, 2002 pursuant to 35 U.S.C. §111(b).

BACKGROUND OF THE INVENTION

1. Field of the Invention

The present invention relates to a light-emitting diode (LED), with its light-fetching efficiency exalted, to a method for the fabrication thereof and to an LED lamp using the LED.

2. Description of the Prior Art

A light-emitting device endowed with an improved efficiency of energy consumption (external quantum efficiency) has been yearned for with a view to promoting the saving on energy. In the GaN-type light-emitting diode superposed on a sapphire substrate, the external quantum efficiency of the conventional light-emitting diode (LED) operating in the neighborhood of 382 nm has been 24% according to JP-A 2002-164296. The external quantum efficiency, as the product of "(internal quantum efficiency)×(voltage efficiency)×(light fetching efficiency)," is decomposed into the three elements. The two elements other than the actually measurable voltage efficiency (about 90 to 95%) are incapable of actual measurement. Notwithstanding the levels of these elements remain yet to be clarified, the improvement of the internal quantum efficiency that has mainly resorted to the quality of crystal and the optimization of construction has been chiefly studied. On the other hand, as an example of the improvement achieved in the efficiency of fetching light, the method has been in vogue since a long time ago, which represses the total reflection on the interface between resin and air by coating an LED chip with a resin approximating a semiconductor in refractivity, thereby allowing the emitted light to penetrate the resin efficiently, and further forming the resin surface in a spherical shape. Then, as an example of the realization of the increase of the efficiency of fetching light to about twice the ordinary level by grinding a substrate in the shape of an inverse mesa, Cree Corp. of the U.S. has been marketing the product embodying this increase under the designation of X-Bright series.

As a way of implementing the measure to allay the trend of a semiconductor crystal toward dislocation, a method that consists in rendering the surface of a semiconductor crystal substrate irregular and then allowing a semiconductor layer to grow has become generally known. In the case of a semiconductor of the nitride of an element of Group In, for example, it has been demonstrated that the density of dislocation can be allayed by forming grooves in the pattern of stripes on the surface of a sapphire substrate and then inducing epitaxial growth thereon of a GaN buffer layer liable to grow at a low temperature and further thereon of the crystal of the semiconductor of the nitride of an element of Group In liable to grow at a high temperature. It is held that for this decrease of the density of dislocation, the grooves are preferably inclined by an angle of 60° or more. No mention, however, is made of the efficiency of fetching light (refer, for example, to JP-A 2002-164296 and K. Tadamoto, et at., Japanese Journal of Applied Physics, 2001, Vol. 40, p. L583–L585). However, these references do not touch upon the efficiency of fetching light Generally, the light-emitting device (LED) has been incapable of causing a ray of light having an angle of incidence larger than the angle of total reflection to be fetched from a light-emitting layer to the exterior because the refractive index of the light-emitting layer is larger than the refractive index of the external medium.

Object of the present invention is to provide a light-emitting device improved in the efficiency of fetching light by introducing irregularities having a lateral face inclined to the interface between two layers differing in refractivity, thereby enabling the totally reflected ray of light to be fetched to the exterior, a manufacturing method thereof and a LED lamp using the light-emitting device.

To begin with, the circumstances that have brought the present invention to perfection will be described by way of simulation below.

With the object of estimating the efficiency of fetching light and the internal quantum efficiency that are actually unmeasurable, the present inventor estimated the efficiency of fetching light from an LED by optical simulation. As a simplified LED model, a construction formed by superposing a GaN layer measuring the square of 300 μm in area and 6.1 μm in thickness on a sapphire substrate measuring the square of 300 μm in area and 100 μm in thickness was adopted. A point light source capable of isotropically emitting light was disposed at a point forming the center of the square of 300 μm and entering the GaN layer to a depth of 0.1 μm from the GaN surface. The refractive index of sapphire was n=1.8 and that of GaN was n=2.7 (when the wavelength of the emitted light was 380 nm) or n=2.4 (when the wavelength of the emitted light was 400 nm) and the exterior part of the two substances was assumed to be filled with silicone resin having a refractive index of n=1.4. The refractive indexes of GaN at the different wavelengths were determined by subjecting the commercially available GaN bulk substrates to actual measurement. From the point light source, numerous rays of light were emitted in random directions (Monte Carlo method). The rays of light were ramified at the individual interfaces differing in refractivity into the rays of light refracting in accordance with the Fresnel formula and the reflected rays of light at calculated ratios. The number of rays of light emitted was 500,000 and the limit of the cycles of ramification was set at 10. The light collecting surfaces were hypothetically set slightly on resin sides from the interfaces between the resin and each of the back surface of the substrate, the front surface of the semiconductor layer and the lateral surface, and the efficiencies of fetching light from the individual light collecting surfaces were calculated.

Table 1 shows the results of the calculation by simulation of the efficiencies of fetching light from the surface of the substrate, the surface of the semiconductor and the lateral surfaces, respectively in the cases of omitting formation of an irregular construction on the substrate ($\hat{1}$ and $\hat{2}$) and the case of forming an irregular construction shown in FIG. 1 on the surface of the substrate ($\hat{3}$.

TABLE 1

| Calculation of efficiency of fetching light | Refractive index | Back surface of substrate | Front surface of semi-conductor | Lateral surfaces (GaN lateral surface and sapphire lateral surface) | Total |
|---|---|---|---|---|---|
| ① LED having GaN/sapphire sealed with silicone resin, wavelength of emitted light: 400 nm | Resin n = 1.4, GaN n = 2.4, Sapphire substrate n = 1.8 | 7.1% | 7.4% | 10.1% × 4 = 40.4% (7.4%, 2.7%) | 54.9% |
| ② Same as above, wavelength of emitted light: 382 nm | Resin n = 1.4, GaN n = 2.7, Sapphire substrate n = 1.8 | 5.1% | 5.4% | 7.2% × 4 = 28.8% (5.4%, 1.8%) | 39.3% |
| ③ LED having irregular construction (FIG. 1) containing lateral surfaces of angle of inclination of 45° formed in the interface of GaN/sapphire, wavelength of emitted light: 382 nm | Resin n = 1.4, GaN n = 2.7, Sapphire substrate n = 1.8 | 25.7% | 5.3% | Lateral surface perpendicular to grooves in the pattern of stripes 15.3% (0.5%, 14.8%) × 2, lateral surface parallel to grooves in the pattern of stripes 15.4% (0.5%, 14.9%) × 2 | 92.4% |

According to the results, when the substrate is not furnished with the irregular construction, the total of efficiencies of fetching light was about 55% when the wavelength of emitted light was 400 nm and about 40% when the wavelength thereof was 382 nm.

These results are applied to the LED disclosed in Journal of Applied Physics mentioned above. This reference, concerning the LED of the semiconductor of the nitride of an element of Group III using a sapphire substrate, has a mention that the external quantum efficiency is 24% when the wavelength of emitted light is 382 nm and 30% when the wavelength thereof is 400 nm. On the assumption that the external quantum efficiency of 24% (24%=internal quantum efficiency of 60%×voltage efficiency of 95%×(efficiency of fetching light of 40%) and the external quantum efficiency of 30% (30%=internal quantum efficiency of 60%×voltage efficiency of 90%×efficiency of fetching light of 55%), the internal quantum efficiency which has no bearing on the wavelength of emitted light can be uniquely indicated as 60% and the results of the simulation seem to be generally appropriate.

According to this simulation, the efficiency of fetching light is about 55% at a wavelength of 400 nm and about 40% at a wavelength of 382 nm, indicating that it has room for improvement to 1.8 times and 2.5 times respectively the ordinary level. Also, the internal quantum efficiency has room for improvement to about 1.6 times the ordinary level. This invention concerns the efficiency of fetching light among other elements involved herein.

A detailed analysis of the results of the simulation has revealed that when the GaN layer and the sapphire substrate are sealed with a resin having a refractive index n=1.4, the ray of light which has permeated the GaN layer and the sapphire substrate is fetched in 100% through the resin to the exterior and that a solution to the question how the group of rays of light entrapped in the GaN layer are fetched to the sapphire substrate and the resin forms an important key to the improvement in the efficient of fetching light.

For the purpose of enabling the rays of light in the GaN layer to permeate the sapphire substrate and the resin, it is only necessary that the interface between the GaN layer and the substrate be inclined and that the angles of incidence of the rays of light on the interface be prevented from exceeding the angle of total reflection. The optimum angle of inclination is 45°. The results of the calculation performed in the case of introducing the construction of irregularities resembling stripes illustrated in FIG. 1 and having an angle of inclination of 45° to the interface between the GaN layer 3 and the sapphire substrate 1 of the case of ③ given in Table 1 will be shown below. It is noted that the efficiency of fetching light from the sapphire back and lateral surfaces to the exterior is improved, while the efficiency of fetching light from the semiconductor surface through the resin to the exterior is not varied very much. When the wavelength of the emitted light is 382 nm as a total (the refractive index of GaN: 2.7), therefore, it can be expected that the efficiency of fetching light is improved to twice or more the efficiency of the case of ②. Incidentally, as regards the ratio of the upper surface, bottom surface and inclined surfaces of the irregular construction, the construction that is destitute of the upper surface and the lower surface and is formed solely of the inclined surfaces proves advantageous because it has the highest efficiency of fetching light.

The present invention has been perfected on the basis of the results of simulation mentioned above.

SUMMARY OF THE INVENTION

This invention provides a light-emitting device comprising a substrate, a semiconductor layer and a light-emitting layer, wherein the substrate and the semiconductor layer superposed thereon differ in refractivity, the substrate is furnished on the surface thereof underlying the semiconductor layer with irregularities possessing inclined lateral surfaces, and the inclined lateral surfaces form an angle θ to the substrate in the range of 30°<θ<60°.

This invention also provides a light-emitting device comprising a substrate, superposed semiconductor layers and a light-emitting layer, wherein the superposed semiconductor layers mutually differ in refractivity and are furnished on the interface thereof with irregularities possessing inclined lateral surfaces.

In the light-emitting device just mentioned above, the inclined lateral surfaces of the irregularities form an angle θ to the substrate in the range of 30°<θ<60°.

In any one of the light-emitting devices mentioned above, the irregularities are V-shaped grooves in the pattern of stripes, laterally inclined projections in the pattern of stripes or laterally inclined pits.

In any one of the light-emitting devices mentioned above, the substrate is made of sapphire ($Al_2O_3$) and the semiconductor layer is made of $Al_xGa_yIn_{1-x-y}N$ (0≦x≦1, 0≦y≦1).

The present invention also provides a method for the fabrication of a light-emitting device comprising a substrate, a semiconductor layer and a light-emitting layer, comprising using one of methods of high-temperature treatment, selective etching and grinding to provide the substrate on the surface thereof on the side underlying the semiconductor layer with irregularities.

The present invention also provides a method for the fabrication of a light-emitting device comprising a substrate, superposed semiconductor layers and a light-emitting layer, comprising forming a mask for selective growth on the surface of the substrate and furnishing the substrate thereon with semiconductor projections having inclined lateral surfaces to form irregularities having inclined lateral surfaces on the interface of the superposed semiconductor layers.

The present invention also provides a method for the fabrication of a light-emitting device comprising a substrate, superposed semiconductor layers and a light-emitting layer, comprising using one of methods of high-temperature treatment, selective etching and grinding to provide the semiconductor layers on the surfaces thereof with irregularities having inclined lateral surfaces, thereby forming irregularities having inclined lateral surfaces on the interface of the superposed semiconductors.

The present invention further provides a method for the fabrication of a light-emitting device comprising a substrate, a semiconductor layer and a light-emitting layer, comprising forming a mask for selective growth on the surface of the semiconductor layer and providing the semiconductor layer thereon with semiconductor projections having inclined lateral surfaces.

The present invention further provides an LED lamp using any one of the light-emitting devices mentioned above.

As described above, by forming an irregular construction on the surface of the substrate of the semiconductor light-emitting device or forming an irregular construction having inclined lateral surfaces on the interface of the semiconductor layers, the present invention makes it possible to enhance the efficiency of fetching light.

BRIEF DESCRIPTION OF THE DRAWINGS

FIG. 2 is a typical diagram illustrating one example of the construction of a semiconductor light-emitting device according to this invention.

FIG. 3(a) is a typical diagram illustrating an example of the irregular construction formed such as on a substrate in the present invention, which comprises V-shaped grooves.

FIG. 3(b) is a typical diagram illustrating an example of the irregular construction formed such as on a substrate in the present invention, which comprises pits of a hexagonal cone trapezoidal in cross section.

FIG. 3(c) is a typical diagram illustrating an example of the irregular construction formed such as on a substrate in the present invention, which comprises triangle projections in the pattern of stripese.

DESCRIPTION OF THE PREFERRED EMBODIMENT

Figure 1:
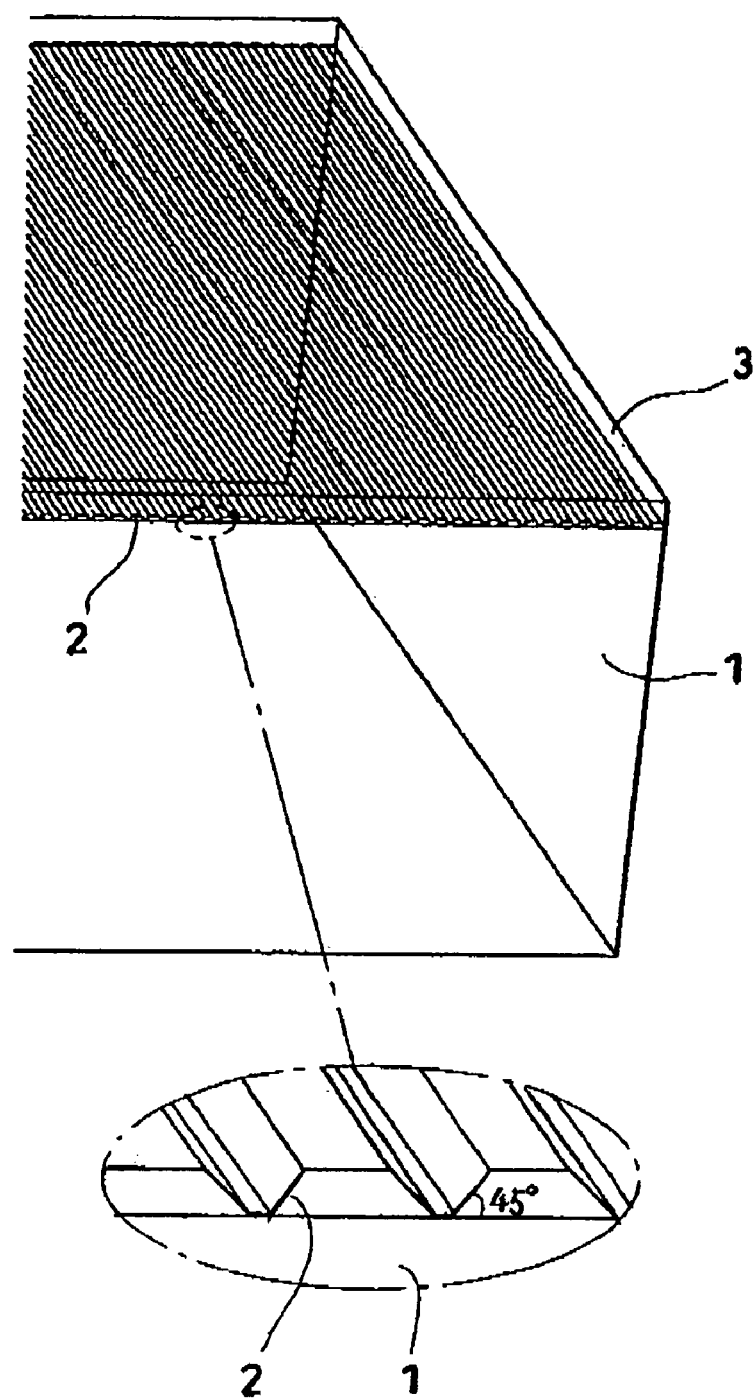
FIG. 1 is a typical diagram illustrating the state in which a sapphire substrate furnished thereon with a GaN layer used for optical simulation has formed thereon an irregular construction possessing lateral surfaces inclined by an angle of 45° relative to the surface of the substrate.

The light-emitting device of the present invention has irregularities having inclined lateral surfaces formed on the surface of a substrate or on the interface of adjacent superposed semiconductor layers. The reflection of light on the interface between a substrate and a semiconductor layer superposed thereon or on the interface of adjacent superposed semiconductor layers occurs when the superposed layers show a change in refractivity across their interface. This invention is aimed at enabling the light to be fetched as much as possible to the exterior of the LED when the two layers differ in refractivity.

The mechanism of the improvement in the efficiency of fetching light brought about by the provision of such irregularities as mentioned above will be omitted from the detailed description under way. Qualitatively, the light reflected on the interface of superposition when the interface is flat is such that it will not frequently issue therefrom to the exterior because the same condition is repeated in accordance as the reflection is repeated. When the interface is furnished with the irregularities, the light once reflected and then allowed to impinge on the interface possibly, if not invariably, forms an angle smaller than the angle of total reflection. It is inferred that the light that issues to the exterior is eventually increased when this situation is repeated.

The light-emitting device of this invention, in the first aspect thereof, provides the substrate on the surface thereof (the side for supporting the semiconductor layer; the same remark applies hereinafter) with irregularities having slanted lateral surfaces and, in the second aspect thereof, provides the adjacent semiconductor layers on the interface of superposition thereof with the irregularities mentioned above. The LED, as illustrated in FIG. 2, has semiconductor layers 3, such as buffer layers, an n-type semiconductor layer 4, a light-emitting layer 5, a p-type semiconductor layer 6, and the like superposed on a substrate 1. The surface of the substrate 1 expected to form the irregularities 2 thereon does not need to be particularly discriminated, but is only required to be any of the interfaces of superposition of two adjacent semiconductor layers differing in refractivity. Preferably, it is selected from among the interfaces that bring great effects. The expression "interface of superposition of semiconductor layers" embraces the interface between a semiconductor layer and a light-emitting layer.

Typical constructions of irregularities formed as on the substrate in this invention are typically illustrated in FIG. 3(a) to FIG. 3(c). FIG. 3(a) depicts the formation of V-shaped grooves in the pattern of stripes on the surface of a substrate, FIG. 3(b) the formation of pits of a trapezoidal cross section resembling hexagonal cones on the surface of a substrate, and FIG. 3(c) the formation of triangular projections made of a semiconductor in the pattern of stripes on the surface of a substrate. The symbol θ shown in the diagrams denotes the angle formed by the inclined lateral surfaces of the irregularities relative to the surface of the substrate. The angle θ of the inclined lateral surfaces of the irregularities formed on the substrate is most preferably 45°. The inclined surfaces are fully effective so long as this angle falls in the range of 30°<θ<60°.

Though the angle of the inclined lateral surfaces of the irregularities formed on the interface between adjacent semiconductor layers does not need to be particularly restricted, it is preferably in the range of 30°<θ<60° similarly to that on the substrate.

The irregularities formed as on the substrate may be made to conform to the plane direction of the substrate or semiconductor layer or may be made to deviate intentionally therefrom. The size and the depth of irregularities may be arbitrarily selected. In consideration of the laudability of flattening the surface of the semiconductor crystal of the nitride of an element of Group III to be grown on the interface forming the irregularities thereon, the diameter of the depression is preferred to be 3 µm or less and the depth of the depression to be 2 µm or less. The flattening can be easily realized by properly selecting the conditions for the growth of the semiconductor layer as demonstrated in Non-Patent Document 1.

As concrete examples of the method for forming irregularities as on the substrate in accordance with this invention, the formation of pits by a high-temperature treatment, the formation of grooves or pits in the pattern of stripes by selective etching, and the formation of V-shaped grooves by the use of an abrasive may be cited. The term "V-shaped grooves" as used herein is expected to embrace those that have a flattened bottom part and those that have more or less rounded lateral surfaces. Besides these depressed shape, projections of a triangular cross section may be formed in the pattern of stripes as. on the substrate by masking the substrate and allowing the semiconductor to grow selectively.

As regards the angle of the inclined surfaces of the irregularities that are formed by the preceding method, the V-shaped grooves by the grinding method have an angle mostly falling in the range of 30° to 60° and the pits by the high-temperature treatment have an angle substantially fixed at 58° or 43° by the crystal plane. When the substrate of SiN is covered with a given mask and the semiconductor of AlN or GaN is grown thereon, the triangular projections that are formed consequently have an angle of inclination of 58° or 43°.

This invention permits use of glass, Si, GaAs and GaP, besides sapphire, GaN, AlN and SiC for the substrate. Among these substances, the case of using sapphire ($Al_2O_3$) for the substrate and the semiconductor of the nitride of an element of Group III for the semiconductor layer proves particularly favorable.

As the plane direction of the sapphire substrate, the m plane, the a plane, the c plane, etc. may be used. Among these planes, the c plane (the (0001) plane) proves particularly favorable. It is further preferable that the vertical axis of the surface of the substrate is inclined in a specific direction from the direction <0001>. Further, the substrate to be used in this invention is preferred to be pretreated with an organic detergent or by etching before it is put to the first step of fabrication because it is enabled to maintain the surface thereof in a fixed state.

In the fabrication of the light-emitting device of this invention, the growth of the n-type layer, p-type layer and light-emitting layer, the formation of the electrodes and the resin sealing may be accomplished by use of any of the heretofore well-known methods. For the growth of a semiconductor by the technique of vapor growth, the method of metal organic chemical vapor deposition (MOCVD method) and the method of vapor phase epitaxy (VPE method) may be adopted. In these methods, the MOCVD method proves particularly favorable because it is capable of flattening the unnecessary construction of irregularities.

Figure 4:
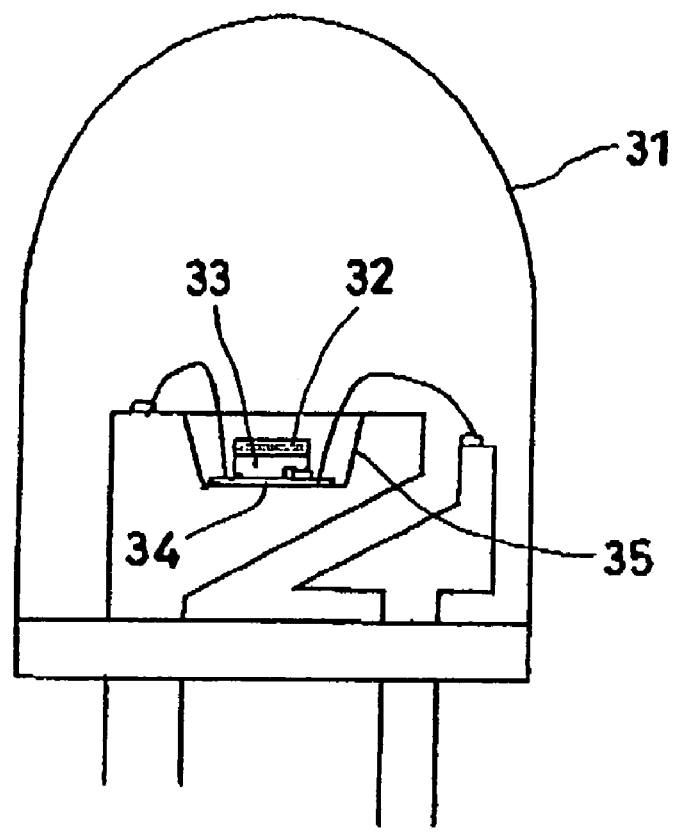
FIG. 4 is a typical diagram illustrating an LED lamp using the light-emitting device according to the present invention.

The light-emitting device of the present invention is subjected to bonding onto a sub-mount 34, connected by wiring to a lead frame and sealed with resin to advantageously fabricate an LED lamp resembling a cannonball as illustrated in FIG. 4.

Now, this invention will be described specifically below with reference to Examples. However, this invention is not restricted to the Examples.

EXAMPLE 1

In Example 1, a sapphire substrate having a (0001) plane as the surface thereof was used. A sand paper having a diamond type abrasive applied. thereto was coated with purified water and rubbed against the sapphire substrate as kept moved in the <1-100> direction of the sapphire substrate so as to form an irregular construction linearly roughly in the <1-100> direction. The depressions in the irregular construction, when observed under an SEM, were found to have a triangular cross section (V-shaped groove) measuring 1 µm in width and 0.5 µm in depth. The angles θ formed between the leading edges of inclined surfaces of the V-shaped grooves and the flat surface of the substrate were approximately in the range of 30° to 60° centering around 45°. When they were observed under a 600-power optical microscope, the ratios of the areas of flat parts and the areas of scratched parts were found to be 2:1 on the average.

The sapphire substrate so fabricated to incorporate therein V-shaped grooves as described above was thoroughly washed and put in a MOCVD device. As the first step, the sapphire substrate was subjected to a treatment that consisted in sweeping the substrate with a gas containing a gaseous mixture formed of the vapor of trimethyl aluminum (TMAl) and the vapor of trimethyl gallium (TMGa) at a molar ratio of 1:2 and a gas containing ammonia ($NH_3$). The V/III ratio under the conditions used in the first step was about 85. Subsequently, as the second step, the substrate was swept with TMGa and ammonia to induce growth of gallium nitride and eventual formation of a GaN layer formed of gallium nitride crystals on the sapphire substrate fabricated in an irregular shape.

The first and second steps for producing the sample containing the GaN layer were carried out in accordance with the following procedure using the MOCVD method.

First, before the sapphire substrate having the surface thereof fabricated in an irregular shape was introduced to the device, the deposit attached fast to the interior of the reaction furnace during the previous growth in the same device was heated and nitrided in a gas containing ammonia and hydrogen so as to render the deposit less liable to further decomposition. After the reaction furnace had cooled to room temperature, the sapphire substrate mounted on a susceptor made of carbon and used for heating in a glove box which had undergone displacement of the entrapped air with nitrogen gas was introduced into a reaction furnace made of quartz and installed inside an RF coil of an induction heater. After the introduction of the sample, the reaction furnace had the interior thereof purged with a forced current of nitrogen gas. After the current of nitrogen gas was continued for 10 minutes, the induction heater was put to operation and made to elevate the temperature of the substrate over a period of 10 minutes to 1170° C. The substrate, as kept at the temperature of 1170° C. and swept with hydrogen gas and nitrogen gas, was left standing for nine minutes to effect thermal cleaning of the surface of the substrate.

While the thermal cleaning was in progress, a hydrogen carrier gas was supplied to the piping of a container (bubbler) holding trimethyl gallium (TMGa) as a raw material and a container (bubbler) holding trimethyl aluminum (TMAl) both connected to the reaction furnace to start a bubbling treatment. The temperature of each of the bubblers was adjusted to a fixed level by the use of a constant temperature bath intended to adjust temperature. The vapors of TMGa and TMAl generated by the bubbling were supplied together with the carrier gas to the piping of a removal device till the step for growth began and they were then released via the removal device to the exterior of the system. After the thermal cleaning was terminated, the valve for the nitrogen carrier gas was closed in order to limit the supply of gas to the interior of the reaction furnace to hydrogen.

Subsequent to the switchover of the carrier gas, the temperature of the substrate was lowered to 1150° C. After the stabilization of this temperature at 1150° C. was confirmed, the valve of the ammonia piping was opened to start the flow of ammonia into the furnace. Then, the valves of the piping for TMGa and piping for TMAl were switched simultaneously to supply the gas containing the vapors of TMGa and TMAl into the reaction furnace and start the first step of depositing the semiconductor of the nitride of an element of Group III on the sapphire substrate. The amounts of TMGa and TMAl to be supplied were adjusted to a molar ratio of 2:1 by means of a flow volume adjuster inserted in the piping used for bubbling, and the amount of ammonia was adjusted so as to set the V/III ratio at 85.

After this treatment had lasted for six minutes, the valves in the piping for TMGa and piping for TMAl were simultaneously switched over to stop the supply of the gas containing the vapors of TMGa and TMAl into the reaction furnace. Subsequently, the supply of ammonia was stopped as well and the furnace was left standing in the ensuing state for three minutes.

After the annealing had lasted for three minutes, the valve in the piping for ammonia gas was switched over to start again the supply of ammonia gas into the furnace. The flow of ammonia was allowed to continue without any variation for four minutes. In this while, the flow volume of TMGa through the piping thereof was adjusted with the relevant flow volume adjuster. After the elapse of four minutes thence, the valve for TMGa was switched over to start the supply of TMGa into the furnace and initiate the growth of GaN. The growth of the GaN layer was continued over a period of about three hours.

Subsequently, an n-type layer, a light-emitting layer and a p-type layer were sequentially superposed in the order mentioned in the next step to produce an epitaxial wafer for an LED.

To begin with, while the supply of TMGa was being continued, the supply of $SiH_4$ was started and the ensuing growth of a low Si-doped n-type GaN layer was continued for about one hour and 15 minutes. The amount of $SiH_4$ to be supplied was so adjusted that the electron concentration in the low Si-doped GaN layer would reach $1\times10^{17}$ $cm^{-3}$. The thickness of the low Si-doped GaN layer was 2 μm.

Further, on this low Si-doped GaN layer, a high Si-doped n-type GaN layer was grown. After the growth of the low Si-doped GaN layer, the supply of TMGa and $SiH_4$ to the interior of the furnace was suspended over a period of one minute. During this suspension, the flow volume of $SiH_4$ was varied. The amount of $SiH_4$ to be supplied was studied in advance and adjusted so that the electron concentration in the high Si-doped GaN layer would reach $1\times10^{19}$ $cm^{-3}$. The supply of ammonia into the furnace was continued at the unchanged flow volume.

After the one-minute's suspension, the supply of TMGa and $SiH_4$ was resumed and the ensuing growth was continued over the period of one hour. By this procedure, the high Si-doped n-type GaN layer having a thickness of 1.8 μm was formed.

After the growth of the high Si-doped GaN layer, the valves for TMGa and $SiH_4$ were switched to stop the supply of these raw materials into the furnace. While the supply of ammonia was continued at the unchanged flow volume, the valves were switched to change the carrier gas from hydrogen to nitrogen. Thereafter, the temperature of the substrate was lowered from 1160° C. to 830° C.

While the temperature of the interior of the furnace was being changed, the amount of $SiH_4$ to be supplied was varied. The amount of supply was studied in advance and adjusted so that the electron concentration in the Si-doped InGaN clad layer would reach $1\times10^{17}$ $cm^{-3}$. The supply of ammonia into the furnace was continued at the unchanged flow volume. The supply of a carrier gas to the bubblers of trimethyl indium (TMIn) and triethyl gallium (TEGa) was started in advance. The $SiH_4$ gas and the vapors of TMIn and TEGa generated by bubbling were supplied together with the carrier gas to the piping of the removal device till the step for growing a clad layer began, and they were released via the removal device into the exterior of the system.

Subsequently, while the state of the interior of the furnace was being stabilized, the valves for TMIn, TEGa and $SiH_4$ were simultaneously switched to start the supply of these raw materials to the interior of the furnace. This supply was continued over a period of about 10 minutes to form an n-type clad layer formed of Si-doped $In_{0.03}Ga_{0.97}N$ in a thickness of 100 Å.

Thereafter, the valves for TMIn, TEGa and $SiH_4$ were switched to stop the supply of these raw materials.

Next, a light-emitting layer of the multiple quantum well construction formed of a barrier layer of GaN and a well layer of $In_{0.06}Ga_{0.94}N$ was produced. In the production of the construction of multiple quantum well, first a barrier layer of GaN was formed on an n-type clad layer formed of Si-doped $In_{0.03}Ga_{0.97}N$ and then a well layer of $In_{0.06}Ga_{0.94}N$ was formed on the GaN barrier layer. The formation of this construction was performed up to five repetitions and then a sixth GaN barrier layer was formed on the fifth $In_{0.06}Ga_{0.94}N$ well layer to give rise to a construction having two GaN barrier layers bordering one each on the opposite sides of the multiple quantum well construction.

Specifically, after the growth of the n-type clad layer was terminated, the operation was suspended over a period of 30 seconds. Subsequently, while the temperature of the substrate, the pressure inside the furnace and the flow volume and kind of a carrier gas were retained unchanged, the valve for TEGa was switched to supply TEGa to the interior of the furnace. After the supply of TEGa was continued over a period of seven minutes, the valve was switched again to stop the supply of TEGa and terminate the growth of the GaN barrier layer. Consequently, the GaN barrier layer having a thickness of 70 Å was formed.

While the growth of the GaN barrier layer was being continued, the flow volume of TMIn to the piping for the removal device was adjusted in molar ratio to twice the flow volume existing during the growth of the clad layer.

After the growth of the GaN barrier layer was terminated, the supply of the raw material of Group III was suspended over a period of 30 seconds and, with the temperature of the substrate, the pressure in the furnace and the flow volume and kind of a carrier gas retained unchanged, the valves for TEGa and TMIn were switched to effect the supply of TEGa and TMIn into the furnace. After the supply of TEGa and TMIn was continued over a period of two minutes, the valves were switched again to stop the supply of TEGa and TMIn and terminate the growth of the well layer of $In_{0.06}Ga_{0.94}N$. Consequently, the $In_{0.06}Ga_{0.94}N$ well layer having a thickness of 20 Å was formed.

After the growth of the $In_{0.06}Ga_{0.94}N$ well layer was terminated, the supply of the raw material of Group III was suspended over a period of 30 minutes and, with the temperature of the substrate, the pressure in the furnace and the flow volume and kind of a carrier gas retained unchanged, the supply of TEGa into the furnace was started to resume the growth of the GaN barrier layer.

By performing this procedure up to five repetitions, five GaN barrier layers and five $In_{0.06}Ga_{0.94}N$ well layers were produced. Furthermore, a GaN barrier layer was formed on the last $In_{0.06}Ga_{0.94}N$ well layer.

On the multiple quantum well construction perfected by this GaN barrier layer, a non-doped $Al_{0.2}Ga_{0.8}N$ diffusion-preventing layer was produced.

The supply of the carrier gas to the bubbler for trimethyl aluminum (TMAl) was started in advance. The vapor of TMAl generated by the bubbling and the carrier gas were together advanced to the piping to the removal device till the step for growing the diffusion-preventing layer began, and they were released via the removal device to the exterior of the system.

While the pressure in the furnace was being stabilized, the valves for TEGa and TMAl were switched to start the supply of these raw materials into the furnace. After the ensuing growth was continued over a period of about three minutes, the supply of TEGa and TMAl was stopped to terminate the growth of the non-doped $Al_{0.2}Ga_{0.8}N$ diffusion-preventing layer. Consequently, the non-doped $Al_{0.2}Ga_{0.8}N$ diffusion-preventing layer having a thickness of 30 Å was formed.

A p-type clad layer formed of Mg-doped GaN was produced on this non-doped $Al_{0.2}Ga_{0.8}N$ diffusion-preventing layer.

After the growth of the non-doped $Al_{0.2}Ga_{0.8}N$ diffusion-preventing layer was terminated by stopping the supply of TEGa and TMAl, the temperature of the substrate was elevated to 1100° C. over a period of two minutes. Further, the carrier gas was changed to hydrogen. The supply of the carrier gas to the bubbler for biscyclopentadienyl magnesium ($Cp_2Mg$) was started in advance as well. The vapor of $Cp_2Mg$ generated by the bubbling and the carrier gas were together advanced to the piping for the removal device till the step for the growth of the Mg-doped GaN layer began, and they were released via the removal device to the exterior of the system.

While the pressure in the furnace was being stabilized by the variation of temperature and pressure, the valves for TMGa and $Cp_2Mg$ were switched to start the supply of these raw materials into the furnace. The amount of $Cp_2Mg$ to be supplied was studied in advance and adjusted so that the hole-concentration in the p-type clad layer formed of Mg-doped GaN would reach $8\times10^{17}$ $cm^{-3}$. Subsequently, after the ensuing growth was continued over a period of about six minutes, the growth of the Mg-doped GaN layer was terminated through stopping the supply of TMGa and $Cp_2Mg$. As a result, the Mg-doped GaN layer having a thickness of 0.15 μm was formed.

After the growth of the Mg-doped GaN layer was terminated, the supply of electricity to the induction heater was terminated and the temperature of the substrate was allowed to fall to normal room temperature over a period of twenty minutes. During the fall of the growth temperature to 300° C., the carrier gas in the furnace was formed exclusively of nitrogen to supply $NH_3$ up to 1% by volume. Subsequently, the supply of $NH_3$ was stopped and the use of the carrier gas formed solely of nitrogen in the reaction furnace was started at the time that the arrival of the temperature of the substrate at 300° C. was confirmed. The wafer was removed from the furnace into the ambient air after the fall of the temperature of the substrate to room temperature was confirmed.

By the procedure described above, the epitaxial wafer furnished with the epitaxial layer construction for use in a semiconductor light-emitting device was fabricated. In this wafer, the Mg-doped GaN layer exhibited the p-type behavior without undergoing an annealing treatment necessary for activating a p-type carrier.

Subsequently, a light-emitting diode, one kind of semiconductor light-emitting devices, was fabricated by the use of the epitaxial wafer having the epitaxial layer construction superposed on the sapphire substrate. On the, surface of the Mg-doped GaN layer of the produced wafer, a p electrode bonding pad composed of titanium, aluminum and gold superposed sequentially in the order mentioned from the surface side and a transparent p electrode formed solely of Au and joined thereto were formed by the well-known technique of photolithography to give rise to a p-side electrode.

Further, the wafer was subsequently subjected to dry etching-so as to expose the part of the high Si-doped GaN layer that formed the n-side electrode. On the exposed part, an n electrode formed of four layers of Ni, Al, Ti and Au was produced.

In the wafer that had the p-side and n-side electrodes formed as described above, an LED lamp having a construction shown in FIG. 4 was fabricated by the following procedure. The back surface of the sapphire substrate was ground to a thickness of 100 μm to form a mirror-like surface. Subsequently, the wafer was cut into chips in the shape of the square of 350 μm. The chip was bonded onto a sub-mount 34 in a mount cup 35, with the semiconductor 33 and electrode on the lower side, and connected to a lead frame from the electrode terminal on the sub-mount 34 to give birth to a flip tip type light-emitting device. Further, the light-emitting device was sealed with silicone resin 31 in a substantially hemispherical shape to fabricate an LED lamp resembling a cannonball as illustrated in FIG. 4.

When an electric current of 20 mA was passed in the forward direction between the p-side and n-side electrodes of the LED lamp thus fabricated, the wavelength of the emitted light was found to be 380 nm, the output value 14.0 mW, and the forward-direction voltage 3.4 V.

The LED chip not yet sealed with the resin was exposed to the flow of electric current. When the surface of this electrified chip was observed under an optical microscope, it was found to emit throughout the entire surface thereof a ray of discernible yellow light that seemed to be light emission between the deep levels of GaN. In this light emission, the presence of a linear portion of strong intensity of emission in the sapphire <1-100> direction was confirmed.

COMPARATIVE EXAMPLE

In the present Comparative Example, an LED was fabricated by following the procedure of Example 1 substantially wholly while allowing the sapphire surface to remain in a flat state.

An LED lamp shaped like a cannonball was manufactured, similarly to the LED lamp of Example 1, by using a sapphire substrate having a flat surface and an LED grade epitaxial wafer grown by the same method as in Example 1. This LED lamp, when exposed to an electric current of 20 mA, was found to emit light having a wavelength of 380 nm and an output value of 7.8 mW. The LED lamp of Example 1 was confirmed to have an output 1.8 times the output of the LED lamp of this Comparative Example.

EXAMPLE 2

In Example 2, a sapphire substrate provided with an AlN film having a (0001) plane as the surface thereof and measuring 1 μm in thickness was used. By subjecting this substrate to a high temperature processing in a reducing atmosphere at 1400° C., pits shaped like hexagonal cones and indeterminate irregularities were formed on the AlN surface. The pits measured approximately 0.5 to 2 μm in diameter and part of them in larger sizes had the bottom surfaces thereof reach the sapphire substrate and some if not all of them assumed the shape of a hexagonal trapezoid. The ratio of the area occupied by the pits and the indeterminate irregularities to the area occupied by the flat part, was approximately in the range of 1:0.2 to 1:4. The inclined surfaces of the hexagonal cones were divided into two kinds, the one kind having (11–22) planes of AlN and the other having (1–102) planes thereof. The angles θ formed between the inclined surfaces of the hexagonal cones and the flat surface of the substrate were 58° and 43°, respectively.

The sapphire substrate furnished with the AlN film having the pits formed thereon as described above was thoroughly washed, placed in a MOCVD device and processed therein in the same manner as in Example 1 to fabricate an epitaxial wafer for use in an LED.

An LED lamp shaped like a cannonball was produced in the same manner as in Example 1 by using the LED grade epitaxial wafer grown by the method described above. This LED lamp, when exposed to the flow of electricity of 20 mA, emitted light having a wavelength of 380 nm and an output value of 12.6 mW. This output represented an increase to 1.6 times that of the Comparative Example.

When the surface of the LED was observed under an optical microscope while the LED was being exposed to the flow of electricity, it was found to emit throughout the entire surface thereof a ray of discernible yellow light that seemed to be light emission between the deep levels of GaN. In the area of this light emission, the presence of hexagonal bright spots of strong emission intensity was observed.

EXAMPLE 3

In Example 3, a sapphire substrate having a (0001) plane as the surface thereof was used. On this substrate, was formed a mask for selective growth that was formed of SiN film in the shape of stripes running parallel to the <1-100> direction of sapphire and measured 2 μm in line width and 2 μm in space width. The substrate covered with the mask was thoroughly washed and then placed in a MOCVD device. Then, as the first step, a gas containing the vapor of trimethyl aluminum (TMAl) was passed through the device at an elevated temperature and, as the second step, TMAl and ammonia were passed through the device to induce growth of stripes of aluminum nitride having a triangular cross section. The irregularities thus formed on the substrate were flattened with a gallium nitride layer. The substrate was then processed to produce an LED construction.

The manufacture of a sample incorporating the aforementioned AlN layer was carried out by the following procedure using the MOCVD method. First, a sapphire substrate was introduced into a reaction furnace made of quartz and installed in an RF coil of an induction heater. The sapphire substrate was mounted on a susceptor made of carbon and intended for heating in a glove box that had undergone displacement with nitrogen gas. After the introduction of the sample, the reaction furnace had the interior thereof purged by passing nitrogen gas.

After the flow of nitrogen gas was continued over a period of ten minutes, the induction heater was put to operation so as to elevate the temperature of the substrate to 600° C. over a period of ten minutes. The substrate, with the temperature thereof kept unchanged at 600° C., was left standing for nine minutes while the flow of hydrogen gas was continuing. In the meanwhile, the hydrogen carrier gas was supplied to the piping for the container (bubbler) holding trimethyl gallium (TMGa) as a raw material and to the piping for the container (bubbler) holding trimethyl aluminum (TMAl) as a raw material, both connected to the reaction furnace so as to start bubbling. The temperatures of the bubblers were adjusted in advance to respectively fixed levels by the use of a constant temperature bath intended to adjust temperature. The vapors of TMGa and TMAl generated by the bubbling and the carrier gas were supplied together to the piping for the removal device till the step for growth began, and they were released via the removal device to the exterior of the system. Thereafter, the valve for the nitrogen carrier gas was closed and the supply of hydrogen gas to the interior of the reaction furnace was started.

After the carrier gas was switched, the temperature of the substrate was elevated to 1150° C. After the stabilization of the temperature at 1150° C. was confirmed, the valve in the piping for TMAl was switched so as to supply the gas containing the vapor of TMAl into the reaction furnace. It is surmised that at this time, a small amount of nitrogen was supplied together with TMAl owing to the decomposition of the deposit adhering to the wall and ceiling of the reaction furnace. After the treatment that was performed for nine minutes, the valve in the piping for TMAl was switched so as to stop the supply of the gas containing the vapor of TMAl into the reaction furnace. The reaction furnace in the ensuing state was retained unchanged for three minutes.

After the annealing which was continued for three minutes, the valve in the piping for ammonia gas was switched so as to start the supply of ammonia gas into the furnace. The flow of ammonia was retained unchanged for four minutes. In this while, the flow volume through the piping for TMAl was adjusted with a flow volume adjuster. After the elapse of four minutes thence, the valve for TMAl was switched so as to start the supply of TMAl into the furnace and induce growth of AlN.

The growth of the AlN layer was continued over a period of about three hours. When the sample withdrawn from the furnace at this stage was visually examined, it was found to have formed AlN irregularities of a triangular cross section having the apex thereof reach the surface of sapphire exposed in the pattern of stripes. At this stage, the SiN mask was embedded with the AlN. The inclined surfaces of the irregularities were (1-102) planes of AlN forming an angle of 43° with the flat surface of the substrate. Subsequently, the valve in the piping for TMAl was switched so as to terminate the supply of the raw material to the reaction furnace and stop the growth.

After the growth of the AlN layer was terminated, the growth of the GaN layer was continued. The growth was continued for three hours to flatten the grown surface of the GaN layer. Then, an n-type layer, a light-emitting layer and a p-type layer were sequentially superposed thereon in the order mentioned to give rise to an epitaxial wafer for use in an LED.

An LED lamp of the shape of a cannonball was manufactured in the same manner as in Example 1 by using the LED grade epitaxial wafer grown by the method described above. This LED lamp, when exposed to the flow of an electric current of 20 mA, emitted light having a wavelength of 380 nm and an output value of 14.8 mW. This output represented an increase of output to 1.9 times the output obtained in the Comparative Example.

When the surface of the LED (sapphire surface) was observed under an optical microscope while the LED was being exposed to the flow of electricity, it was found to emit throughout the entire surface thereof a ray of discernible yellow light which seemed to be light emission between the deep levels of GaN. In the area of this light emission, a portion of thick bright lines of strong intensity of emission in the shape of stripes and a portion of weak thin dark lines were observed.

Since the use of the light-emitting device of this invention results in increasing the efficiency of fetching light roughly to twice the ordinary level at most, this light-emitting device can also exalt the output of light emission and the efficiency of electricity-light conversion of the LED to about twice the ordinary levels at most. This fact not merely contributes to the saving of energy but also represses the emission of heat from the device due to re-absorption of light and improves the stable operation and service life of the LED.

The invention claimed is:

1. A light-emitting device comprising a substrate, a semiconductor layer and a light-emitting layer, wherein the substrate and the semiconductor layer superposed thereon differ in refractivity, the substrate is furnished on a surface thereof underlying the semiconductor layer with irregularities possessing inclined lateral surfaces, and the inclined lateral surfaces form an angle θ to the substrate in the range of 30°<θ<60°.

2. The light-emitting device according to claim 1, wherein the irregularities are V-shaped grooves in a pattern of stripes, laterally inclined projections in a pattern of stripes or laterally inclined pits.

3. The light-emitting device according to claim 2, wherein the substrate is made of sapphire ($Al_2O_3$) and the semiconductor layer is made of $Al_xGa_yIn_{1-x-y}N$ ($0 \leq x \leq 1$, $0 \leq y \leq 1$).

4. An LED lamp using the light-emitting device according to claim 3.

5. An LED lamp using the light-emitting device according to claim 2.

6. The light-emitting device according to claim 1, wherein the substrate is made of sapphire ($Al_2O_3$) and the semiconductor layer is made of $Al_xGa_yIn_{1-x-y}N$ ($0 \leq x \leq 1$, $0 \leq y \leq 1$).

7. An LED lamp using the light-emitting device according to claim 6.

8. An LED lamp using the light-emitting device according to claim 1.

9. A light-emitting device comprising a substrate, superposed semiconductor layers and a light-emitting layer, wherein the superposed semiconductor layers mutually differ in refractivity and are furnished on an interface thereof with irregularities possessing inclined lateral surfaces.

10. The light-emitting device according to claim 9, wherein, the inclined lateral surfaces of the irregularities form an angle θ to the substrate in the range of 30°<θ<60°.

11. The light-emitting device according to claim 10, wherein the irregularities are V-shaped grooves in a pattern of stripes, laterally inclined projections in a pattern of stripes or laterally inclined pits.

12. The light-emitting device according to claim 11, wherein the substrate is made of sapphire ($Al_2O_3$) and the semiconductor layer is made of $Al_xGa_yIn_{1-x-y}N$ ($0 \leq x \leq 1$, $0 \leq y \leq 1$).

13. An LED lamp using the light-emitting device according to claim 12.

14. An LED lamp using the light-emitting device according to claim 11.

15. The light-emitting device according to claim 10, wherein the substrate is made of sapphire ($Al_2O_3$) and the semiconductor layer is made of $Al_xGa_yIn_{1-x-y}N$ ($0 \leq x \leq 1$, $0 \leq y \leq 1$).

16. An LED lamp using the light-emitting device according to claim 15.

17. An LED lamp using the light-emitting device according to claim 10.

18. The light-emitting device according to claim 9, wherein the irregularities are V-shaped grooves in a pattern of stripes, laterally inclined projections in a pattern of stripes or laterally inclined pits.

19. The light-emitting device according to claim 18, wherein the substrate is made of sapphire ($Al_2O_3$) and the semiconductor layer is made of $Al_xGa_yIn_{1-x-y}N$ ($0 \leq x \leq 1$, $0 \leq y \leq 1$).

20. An LED lamp using the light-emitting device according to claim 19.

21. An LED lamp using the light-emitting device according to claim 18.

22. The light-emitting device according to claim 9, wherein the substrate is made of sapphire ($Al_2O_3$) and the semiconductor layer is made of $Al_xGa_yIn_{1-x-y}N$ ($0 \leq x \leq 1$, $0 \leq y \leq 1$).

23. An LED lamp using the light-emitting device according to claim 22.

24. An LED lamp using the light-emitting device according to claim 9.

* * * * *